(12) United States Patent
Mauder et al.

(10) Patent No.: US 10,164,043 B2
(45) Date of Patent: Dec. 25, 2018

(54) SEMICONDUCTOR DIODE AND METHOD FOR FORMING A SEMICONDUCTOR DIODE

(75) Inventors: Anton Mauder, Kolbermoor (DE); Hans-Joachim Schulze, Taufkirchen (DE); Philipp Seng, Munich (DE)

(73) Assignee: Infineon Technologies AG, Neubiberg (DE)

( * ) Notice: Subject to any disclaimer, the term of this patent is extended or adjusted under 35 U.S.C. 154(b) by 77 days.

(21) Appl. No.: 13/347,749

(22) Filed: Jan. 11, 2012

(65) Prior Publication Data
US 2013/0175529 A1  Jul. 11, 2013

(51) Int. Cl.
*H01L 29/66* (2006.01)
*H01L 29/861* (2006.01)
(Continued)

(52) U.S. Cl.
CPC .......... *H01L 29/456* (2013.01); *H01L 29/861* (2013.01); *H01L 29/0619* (2013.01);
(Continued)

(58) Field of Classification Search
CPC ............... H01L 29/861; H01L 29/8611; H01L 29/0619; H01L 29/0634; H01L 29/402;
(Continued)

(56) References Cited

U.S. PATENT DOCUMENTS 4,146,906 A * 3/1979 Miyata ................ H01L 21/2257
148/DIG. 122
4,875,085 A * 10/1989 Ueno et al. .................... 257/554
(Continued)

FOREIGN PATENT DOCUMENTS

CN 101288179 A 10/2008
GB 2087648 A 5/1982

OTHER PUBLICATIONS

Thurber et al., The Relationship Between Resistivity and Dopant Density for Phosphorus- and Boron-Doped Silicon, May 1981, National Bureau of Standards Special Publication 400-64, pp. 1-26.*

(Continued)

*Primary Examiner* — Natalia Gondarenko
(74) *Attorney, Agent, or Firm* — Murphy, Bilak & Homiller, PLLC

(57) ABSTRACT

A semiconductor diode is provided. The semiconductor diode includes a monocrystalline silicon semiconductor body including a first semiconductor region of a first conductivity type extending to a first surface of the semiconductor body and having a first maximum doping concentration, and a second semiconductor region of a second conductivity type forming a pn-junction with the first semiconductor region. The semiconductor diode further includes a polycrystalline silicon semiconductor region of the first conductivity type having a second maximum doping concentration which is higher than the first maximum doping concentration and adjoining the first semiconductor region on the first surface, a first metallization arranged on the polycrystalline silicon semiconductor region and in electric contact with the polycrystalline semiconductor region, and an edge-termination structure arranged next to the first semiconductor region. Further, a method for producing a semiconductor diode is provided.

19 Claims, 17 Drawing Sheets

(51) Int. Cl.
| | |
|---|---|
| *H01L 29/02* | (2006.01) |
| *H01L 29/06* | (2006.01) |
| *H01L 29/12* | (2006.01) |
| *H01L 29/36* | (2006.01) |
| *H01L 29/45* | (2006.01) |
| *H01L 21/44* | (2006.01) |
| *H01L 29/40* | (2006.01) |

(52) U.S. Cl.
CPC ............ *H01L 29/36* (2013.01); *H01L 29/402* (2013.01); *H01L 29/404* (2013.01); *H01L 29/407* (2013.01)

(58) Field of Classification Search
CPC ............... H01L 29/0692; H01L 29/872; H01L 29/0615; H01L 29/404; H01L 29/7811; H01L 29/1095; H01L 29/7802; H01L 29/407; H01L 29/0255; H01L 29/6609; H01L 29/66128; H01L 29/66136; H01L 29/66212; H01L 29/66333; H01L 29/66462; H01L 29/41741; H01L 29/66143; H01L 27/0814; H01L 2224/32145; H01L 29/02; H01L 29/04; H01L 29/456; H01L 27/095; H01L 29/66204; H01L 29/6612; H01L 29/045; H01L 29/06; H01L 29/0623; H01L 29/70; H01L 29/7393; H01L 29/7391; H01L 29/78; H01L 29/7804; H01L 29/7827; H01L 29/7828; H01L 29/781; H01L 29/7851; H01L 29/7926; H01L 29/8613; H01L 21/02532; H01L 21/02647; H01L 21/28512; H01L 21/3205; H01L 21/324; H01L 21/322; H01L 21/3242; H01L 21/76838; H01L 27/0664; H01L 21/822; H01L 21/8222; H01L 21/8224; H01L 21/8226; H01L 21/8248

USPC ... 257/51, 64, 487–496, 67, 69, 73, 77, 183, 257/527; 438/332, 382, 488, 576
See application file for complete search history.

(56) References Cited

U.S. PATENT DOCUMENTS

| | | | |
|---|---|---|---|
| 5,444,271 A | | 8/1995 | Kuwahara |
| 5,453,636 A | * | 9/1995 | Eitan et al. .................... 257/378 |
| 5,612,562 A | * | 3/1997 | Siaudeau et al. ............. 257/328 |
| 5,864,167 A | * | 1/1999 | Cutter ................. H01L 29/0638 257/487 |
| 6,285,060 B1 | * | 9/2001 | Korec et al. ................... 257/342 |
| 6,486,524 B1 | * | 11/2002 | Ahmed ............... H01L 27/0788 257/481 |
| 7,259,440 B2 | * | 8/2007 | Kelberlau ...................... 257/493 |
| 2003/0047734 A1 | * | 3/2003 | Fu et al. .......................... 257/64 |
| 2003/0124818 A1 | * | 7/2003 | Luo .......................... C23C 16/24 438/482 |
| 2005/0101097 A1 | * | 5/2005 | Shimamoto et al. ......... 438/332 |
| 2007/0023830 A1 | * | 2/2007 | Pfirsch et al. ................. 257/341 |
| 2008/0173968 A1 | * | 7/2008 | Schulze et al. ............... 257/487 |
| 2008/0265329 A1 | * | 10/2008 | Hirler et al. ................... 257/367 |
| 2009/0008723 A1 | * | 1/2009 | Schmidt ............ H01L 21/26586 257/409 |
| 2009/0189240 A1 | * | 7/2009 | Willmeroth ......... H01L 29/0619 257/488 |
| 2009/0250724 A1 | * | 10/2009 | Ellis .............................. 257/197 |
| 2010/0013458 A1 | * | 1/2010 | Lany et al. ................ 324/123 R |
| 2010/0078765 A1 | * | 4/2010 | Schulze et al. ............... 257/587 |
| 2011/0215338 A1 | * | 9/2011 | Zhang ............................. 257/73 |

OTHER PUBLICATIONS

Lee, L.S. et al. "Reduction of Epitaxial Alignment in n*-p. Poly-Si Emitter Diode Due to Gettering of P and As by Ar Implantation." Electronics Letters, vol. 36, No. 6, Mar. 16, 2000.

* cited by examiner

SEMICONDUCTOR DIODE AND METHOD FOR FORMING A SEMICONDUCTOR DIODE

TECHNICAL FIELD

This specification refers to semiconductor diodes, in particular to high voltage semiconductor diodes and a manufacturing method therefor.

BACKGROUND

Diodes are often desired to have low losses and also a sufficient dynamic robustness and high robustness against cosmic radiation, respectively. For dynamic reasons, in particular to ensure low switching losses and low reverse current peaks, a low efficiency of an anode emitter of the diode, i.e. a low doping of the anode region, is often required to reduce flooding of an adjoining weakly doped semiconductor region with charge carriers. During fast commutating the diode, i.e. during fast switching off or switching the diode from forward to reverse current direction, and/or due to cosmic radiation a high density current of holes may flow towards the anode region. The positive charge of the holes may at least partially compensate the doping charge of the anode region. Accordingly, the space charge region may extend deep into the anode region. In case the space charge region reaches an anode metallization in electric contact with the anode region, a breakdown may occur which in consequence may lead to the destruction of the diode. Highly and/or deeply doped anode regions are often desired to avoid breakdown of diodes. However, highly and/or deeply doped anode regions tend to increase switching losses and reverse current peaks. Furthermore, other known measures to reduce switching losses and reverse current peaks of diodes are often accompanied by undesired side effects. For example, the charge carrier life time in the anode region and/or in the semiconductor material below the anode region may be reduced by irradiation or ion implantation using protons, helium, or argon, for example. However, an increased reverse current, which is particularly unfavorable for high voltage diodes, is observed in this case.

Accordingly, there is a need to provide a diode with improved trade-off between dynamic properties and robustness during fast commutation and against cosmic radiation, respectively.

SUMMARY

According to an embodiment of a semiconductor diode, the semiconductor diode includes a monocrystalline silicon semiconductor body including a first semiconductor region of a first conductivity type extending to a first surface of the semiconductor body and having a first maximum doping concentration and a second semiconductor region of a second conductivity type forming a pn-junction with the first semiconductor region. The semiconductor diode further includes: a polycrystalline silicon semiconductor region of the first conductivity type having a second maximum doping concentration which is higher than the first maximum doping concentration and adjoining the first semiconductor region on the first surface; a first metallization arranged on the polycrystalline silicon semiconductor region and in electric contact with the polycrystalline semiconductor region; and an edge-termination structure arranged next to the first semiconductor region.

According to an embodiment of a semiconductor diode, the semiconductor diode includes: a monocrystalline silicon semiconductor body having a first surface, a pn-junction and a first semiconductor region of a first conductivity type having a first maximum doping concentration and extending from the pn-junction to the first surface; a first polycrystalline semiconductor layer of the first conductivity type having a third maximum doping concentration and adjoining the first semiconductor region on the first surface; a second polycrystalline semiconductor layer of the first conductivity type adjoining the first polycrystalline semiconductor layer and having a second maximum doping concentration which is higher than the first maximum doping concentration and the third maximum doping concentration; and a first metallization arranged on and electrically contacting the second polycrystalline semiconductor layer.

According to an embodiment of a semiconductor diode, the semiconductor diode includes: a monocrystalline silicon semiconductor body having a first surface, a pn-junction and a first semiconductor region of a first conductivity type having a first maximum doping concentration and extending from the pn-junction to the first surface; a polycrystalline silicon semiconductor region of the first conductivity type having a second maximum doping concentration which is higher than the first maximum doping concentration and a granularity in a range from about 10 nm to about 1000 nm; and a first metallization arranged on the polycrystalline silicon semiconductor region and electrically contacting the first semiconductor region through the second polycrystalline semiconductor region.

According to an embodiment of a semiconductor diode, the semiconductor diode includes: a monocrystalline silicon semiconductor body comprising a first surface, a first semiconductor region of a first conductivity type extending from the pn-junction to the first surface and having a first maximum doping concentration at the first surface of less than about $5*10^{17}$ cm$^{-3}$; a polycrystalline silicon semiconductor region of the first conductivity type adjoining the first semiconductor region on the first surface and having a second maximum doping concentration which is higher than the first maximum doping concentration; and a first metallization arranged on the polycrystalline silicon semiconductor region and in electric contact with the polycrystalline semiconductor region.

According to an embodiment of a method for producing a semiconductor diode, the method includes: providing a monocrystalline silicon semiconductor body comprising a first surface and a second semiconductor region of a second conductivity type; forming in the silicon semiconductor body a first semiconductor region of a first conductivity type so that the first semiconductor region has a first maximum doping concentration, extends to the first surface and forms a pn-junction with the second semiconductor region; forming a polycrystalline silicon semiconductor region of the first conductivity type having a second maximum doping concentration which is higher than the first maximum doping concentration such that the polycrystalline silicon semiconductor region adjoins the first semiconductor region on the first surface; forming an edge-termination structure next to the first semiconductor region; and forming a first metallization on and in electric contact with the polycrystalline semiconductor region.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

Figure 1:
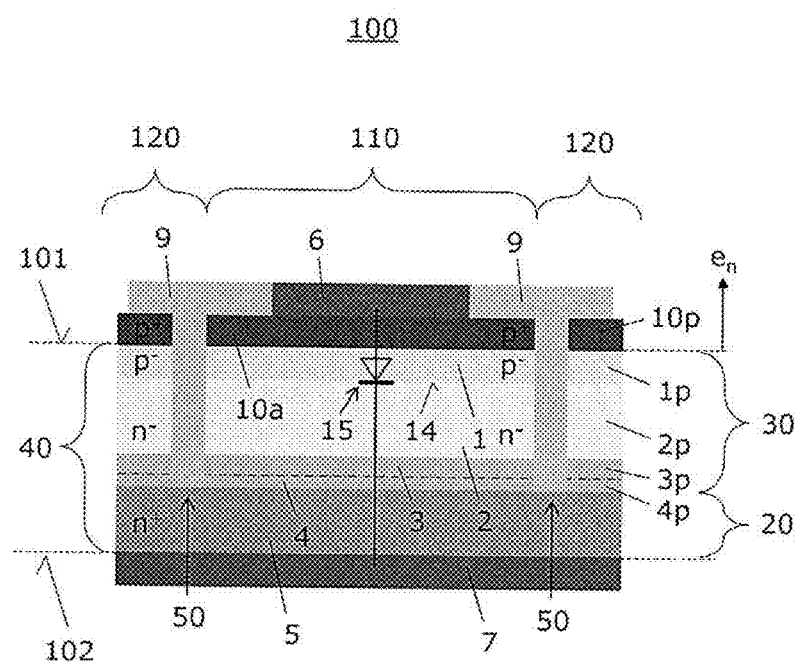
FIG. 1 illustrates a vertical cross-section through a semiconductor diode according to an embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main horizontal surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, p-doped is referred to as first conductivity type while n-doped is referred to as second conductivity type. Alternatively, the semiconductor devices can be formed with opposite doping relations so that the first conductivity type can be n-doped and the second conductivity type can be p-doped. Furthermore, some Figures illustrate relative doping concentrations by indicating "−" or "+" next to the doping type. For example, "n⁻" means a doping concentration which is less than the doping concentration of an "n"-doping region while an "n⁺"-doping region has a larger doping concentration than the "n"-doping region. However, indicating the relative doping concentration does not mean that doping regions of the same relative doping concentration have to have the same absolute doping concentration unless otherwise stated. For example, two different $n^+$-doping regions can have different absolute doping concentrations. The same applies, for example, to an $n^+$-doping and a $p^+$-doping region.

Specific embodiments described in this specification pertain to, without being limited thereto, semiconductor diodes, in particular bipolar semiconductor diodes, and methods for forming semiconductor diodes. Typically, the semiconductor diode is a high voltage diode having an active area for carrying and/or rectifying a load current and a peripheral area having an edge-termination structure.

The term "high voltage diode" as used in this specification intends to describe a semiconductor diode on a single chip with high voltage and/or high current switching capabilities. Typically, the high voltage diode has a rating for reverse voltages of, in particular, above about 400 V and preferably above about 1000 V or even above 1.5 kV.

To reduce the intensity of the electric fields near the edge of a rectifying junction (e.g. pn-junction), high voltage semiconductor devices may include an edge-termination structure in a peripheral area arranged around an active area. The term "edge-termination structure" as used in this specification intends to describe a structure that provides a transition region in which the high electric fields around the active area of the semiconductor device change gradually to the potential at the edge of the device. The edge-termination structure may, for example, lower the field intensity around the termination region of the rectifying junction by spreading the electric field lines across the termination region.

In the context of the present specification, the terms "field plate" and "field electrode" intend to describe an electrode which is arranged next to a pn-junction and configured to expand a depleted portion of at least one of the semiconductor regions forming the pn-junction by applying an appropriate voltage. The field plate may be insulated from the semiconductor region or in electric contact with at least one of the semiconductor regions. To operate the field plate as an edge-termination structure, a voltage applied to a p-type semiconductor region forming a pn-junction with an n-type semiconductor region is also applied to the field plate. The p-type semiconductor region may form an anode region of a semiconductor diode or may form a further p-type semiconductor region embedded in the n-type semiconductor region. The further p-type semiconductor region may, for example, be formed as an island, a stripe, and a closed substantially ring-shaped area when seen from top. A single semiconductor diode may have one or more field plates which may be on different voltages.

In the context of the present specification, the terms "depleted" and "completely depleted" intend to describe that a semiconductor region comprises substantially no free charge carriers.

In the context of the present specification, the term "metallization" intends to describe a region or a layer with metallic or near metallic properties with respect to electric conductivity. A metallization may be in contact with a semiconductor region to form an electrode, a pad and/or a terminal of the semiconductor device. The metallization may be made of or comprise a metal such as Al, Ti, W, Cu and Co but may also be made of a material with metallic or near metallic properties with respect to electric conductivity such as highly doped n-type or p-type poly-Si, TiN or an electrically conductive silicide such as $TaSi_2$, $TiSi_2$, PtSi, $CoSi_2$, $WSi_2$ or the like. The metallization may also include different electrically conductive materials, for example a stack of those materials.

FIG. 1 illustrates a vertical cross-section through a semiconductor diode 100. The semiconductor diode 100 includes a monocrystalline silicon semiconductor body 40 having a first surface 101 defining a vertical direction $e_n$ and a second surface 102 disposed opposite the first surface 101.

The semiconductor body 40 can be a single bulk monocrystalline material. It is also possible that the semiconductor body 40 includes a bulk mono-crystalline substrate 20 and at least one epitaxial layer 30 formed thereon. Using the epitaxial layer(s) 30 provides more freedom in tailoring the background doping of the material since the doping concentration can be adjusted during deposition of the epitaxial layer or layers.

A p-type first semiconductor region 1 extends to the first surface 101 and forms with an n-type second semiconductor region 2 a pn-junction 14. The first semiconductor region 1 is typically weakly doped and has a first maximum doping concentration. The second semiconductor region 2 typically forms a weakly doped drift region of the semiconductor diode 100. For example, the second semiconductor region 2 may be a lightly doped near intrinsic semiconductor region between the p-type first semiconductor region 1 and a higher doped n-type semiconductor region 3, 4.

In the exemplary embodiment illustrated in FIG. 1, the second semiconductor region 2 adjoins an optional n-type third semiconductor region 3 or field-stop region 3 having a higher maximum doping concentration than the second semiconductor region 2, the field-stop region 3 adjoins an n-type fourth semiconductor region 4 or cathode region 4 of even higher maximum doping concentration, and the cathode region 4 adjoins an optional highly doped n-type substrate 5 extending to the second surface 102. The doping concentration of the optional substrate 5 and the cathode region 4, respectively, typically exceed about $10^{19}$ atoms per $cm^3$ at the second surface 102. Accordingly, a low resistive current path to a back side metallization 7 arranged on the second surface 102 and typically forming a cathode metallization is provided.

According to an embodiment, a p-type polycrystalline silicon semiconductor region 10a having a second maximum doping concentration which is higher than the first maximum doping concentration adjoins the first semiconductor region 1 on the first surface 101. A first metallization 6 is arranged on and in electric contact with the polycrystalline semiconductor region 10a. Typically, the first metallization 6 forms an anode metallization. Known contact materials such as, for example, Al, AlSi, AlCu, AlSiCu, Cu etc. can be chosen for the metallization 6, 7. The second maximum doping concentration may be larger than about $10^{19}$ atoms per $cm^3$. Typically, the doping concentration of the polycrystalline silicon semiconductor region 10a is highest at or close to the interface with the first metallization 6 and lowest, for example about $10^{16}$ to $10^{18}$ atoms per $cm^3$, at the interface with the first semiconductor region 1.

The polycrystalline silicon semiconductor region 10a and the first semiconductor region 1 typically form an anode emitter structure. Due to the comparatively high doping of the polycrystalline silicon semiconductor region 10a in a central part 110 of the semiconductor diode 100 forming an active area with a vertical diode 15 defining the forward current direction, a space charge region that is formed in the second semiconductor region 2 and the first semiconductor region 1 when the vertical diode 15 is reverse biased remains spaced apart from the first metallization 6. Furthermore, the semiconductor diode 100 may be fast commutated. The diode 100 may even withstand higher reverse voltages than conventional diodes with a metallization directly contacting a monocrystalline anode area when facing a local carrier generation e. g. caused by the interaction of cosmic radiation with the semiconductor material of the diode 100. On the other hand, semiconductor region 10a is made of polycrystalline silicon having lattice defects. Thus, the charge carrier life time is reduced compared to monocrystalline silicon. Accordingly, switching losses and reverse current peaks of the semiconductor diode 100 are low.

Typically, the granularity of the polycrystalline silicon semiconductor region 10a is in a range from about 10 nm to about 1000 nm, more typically in a range from about 50 nm to about 300 nm to ensure a high enough density of grain boundaries. This means that the polycrystalline silicon semiconductor region 10a has a granular structure substantially consisting of silicon microcrystals sized in a range from about 10 nm to about 1000 nm, more typically from about 50 nm to about 300 nm. Furthermore, the structure of the polycrystalline silicon semiconductor region 10a is typically columnar, i.e. the majority of grain boundaries of the silicon microcrystals are substantially orthogonal to the first surface 101.

According to an embodiment, the polycrystalline silicon semiconductor region 10 includes boron as main dopants. Boron doped polycrystalline silicon may be deposited using LPCVD (Low Pressure Chemical Vapor Deposition) at sufficiently low temperatures to ensure low granularity.

The semiconductor diode 100 is typically a high voltage diode with sufficiently high blocking capability. Accordingly, the rectifying pn-junction 14 is desired to withstand sufficiently high reverse voltages. Unfavorable dimensioning may result in avalanche generation close to or at points where the rectifying pn-junctions come to or near a surface. Accordingly, blocking capability may be reduced to values well below the value of the bulk breakthrough field strength of the semiconductor material.

According to an embodiment, an edge-termination structure is provided next to the first semiconductor region 1 and the pn-junction 14, respectively, to ensure high blocking capability in a peripheral area 120 of the semiconductor diode 100.

In the exemplary embodiment, the edge-termination structure is formed by a dielectric region 9 arranged on the first surface 101 and in vertical trenches 50 extending from the first surface 110 at least partially into the semiconductor body 40, for example into the cathode region 4.

Typically, each vertical trench 50 circumferentially surrounds an active area 110. Accordingly, the two trenches 50 illustrated in FIG. 1 may correspond to portions of a single circumferential vertical trench 50. In this embodiment, substantially ring-shaped n-type semiconductor regions 2p, 3p, 4p, a substantially ring-shaped p-type semiconductor region 1p and a substantially ring-shaped p-type polycrystalline semiconductor region 10p are arranged in the peripheral area 120. However, one or more of the semiconductor regions 2p, 3p, 4p and/or the polycrystalline semiconductor region 10p may also be omitted in the peripheral area 120.

Figure 2:
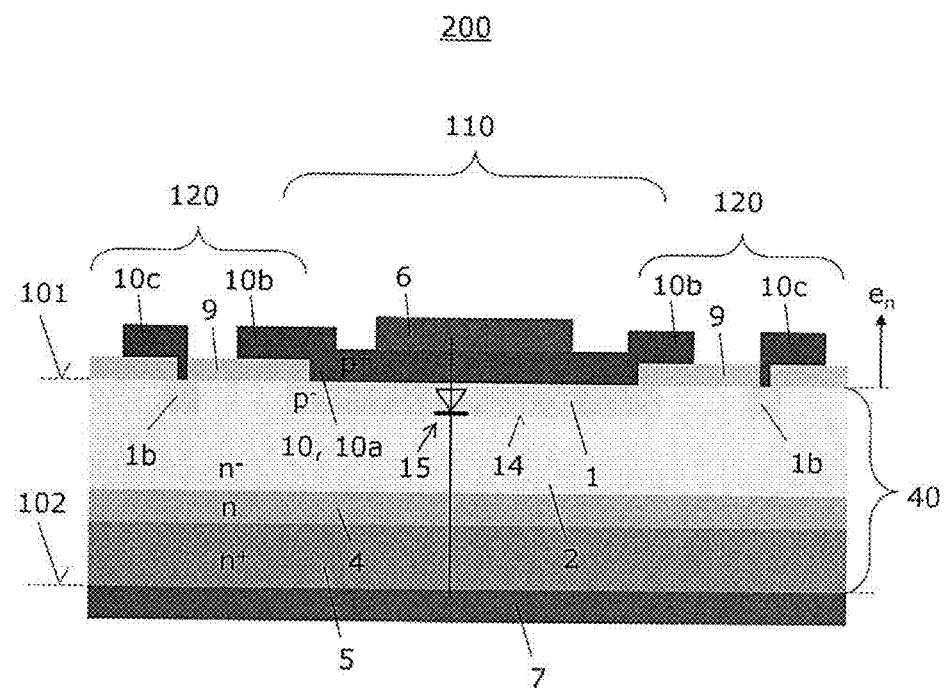
FIG. 2 illustrates a vertical cross-section through a semiconductor diode according to an embodiment.

FIG. 2 illustrates a vertical cross-section through a semiconductor diode 200. The semiconductor diode 200 shown in FIG. 2 is similar to the semiconductor diode 100 explained above with regard to FIG. 1. However, the semiconductor diode 200 shown in FIG. 2 is provided with different edge-termination structures. For sake of clarity, an optional field-stop region is not shown in FIG. 2.

In the exemplary embodiment, two edge-termination structures are provided. A polycrystalline silicon field plate 10b is arranged on the first surface 101 and spaced apart from the semiconductor body 40 by an insulating region 9 arranged on the first surface 101. The insulating region 9 may, for example, be made of silicon oxide, silicon nitride, silicon oxynitride or stacks thereof. The polycrystalline silicon semiconductor region 10a adjoins the field plate 10b. Accordingly, the field plate 10b is also in electric contact with the first semiconductor region 1.

Additionally, a floating guard-ring formed by a p-type semiconductor region 1b formed in the second semiconductor region 2 in contact with a floating field plate 10c is provided. Accordingly, the floating field plate 10c is also in electric contact with the semiconductor body 40. The floating field plate 10c is arranged on the first surface 101 and spaced apart from the semiconductor body 40 by the insulating region 9. The insulating region 9 may have a varying thickness, e.g. the insulating region 9 may be thinner near the first semiconductor region 1 and/or the floating p-type semiconductor region 1b. The field plates 10b, 10c and the p-type polycrystalline silicon semiconductor region 10a may be formed from one layer 10.

In other embodiments, only one of the field plates 10b arranged on the first surface 101 and the floating field plate 10c in contact with a floating guard-ring 1b is provided.

According to embodiments, the number of field plates 10c arranged on the first surface 101 is larger than one. One or more of the field plates 10b and/or the field plates 10c may also be connected to an additional field plate provided by a structured metallization.

According to embodiments, the floating guard ring formed by the p-type semiconductor region 1b and the p-type polycrystalline silicon semiconductor region 10a is only in electric contact with the corresponding field plate 10c and 10b, respectively, in designated contact areas. For example, single contact holes extending through the insulating region 9 may be provided between the field plate 10c and the p-type semiconductor region 1b. These contact holes may be unevenly distributed over the edge-termination system. The contact holes may, for example, be located only in a curved part of the edge-termination system or may only be located in a straight part of the edge-termination system.

According to embodiments, the floating p-type semiconductor region 1b is not shaped as a ring circumferentially surrounding the first semiconductor region 1, but, for example, formed as segments of a circular or an ellipsoidal ring or as islands located only in the corners of the edge-termination system. Alternatively, the floating p-type semiconductor region 1b may be only located in straight parts of the edge-termination system.

Figure 3:
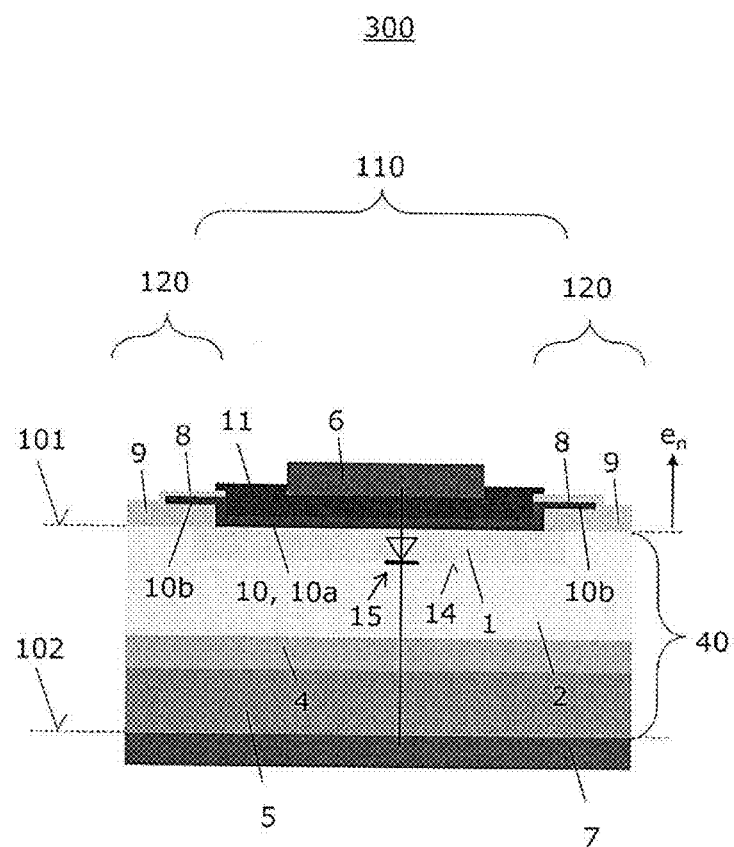
FIG. 3 illustrates a vertical cross-section through a semiconductor diode according to an embodiment.

FIG. 3 illustrates a vertical cross-section through a semiconductor diode 300. The semiconductor diode 300 shown in FIG. 3 is similar to the semiconductor diode 100 explained above with regard to FIG. 1. However, the polycrystalline semiconductor region is formed by two or more polycrystalline semiconductor layers 10a, 11 in FIG. 3. Furthermore, a different edge-termination structure is provided for the semiconductor diode 300 shown in FIG. 3. For sake of clarity, an optional field-stop region is not shown in FIG. 3.

In the exemplary embodiment illustrated in FIG. 3, a p-type first polycrystalline semiconductor layer 10a, 10b having a third maximum doping concentration adjoins the first semiconductor region 1 on the first surface 101. A p-type second polycrystalline semiconductor layer 11 adjoins the first polycrystalline semiconductor layer 10a, 10b. The second polycrystalline semiconductor layer 11 has a second maximum doping concentration which is higher than the first maximum doping concentration of the first semiconductor region 1 and the third maximum doping concentration. The first metallization 6 is arranged on and electrically contacts the second polycrystalline semiconductor layer 11.

In other words, the polycrystalline silicon semiconductor region 10a, 10b, 11 has a first portion 10a, 10b and a second portion 11 arranged between the first portion 10a, 10b and the first metallization 6. The first portion 10a, 10b adjoins the first semiconductor region 1 and has a maximum doping concentration which is lower than a second maximum doping concentration of the second portion 11 and the polycrystalline silicon semiconductor region 10a, 11, respectively.

In the exemplary embodiment, an outer portion 10b of the first polycrystalline semiconductor layer 10a, 10b forms a field plate. The field plate 10b is arranged on the first surface 101 and spaced apart from the semiconductor body 40 by an insulating region 9, typically made of silicon oxide, silicon oxynitride or silicon nitride. Furthermore, a passivation layer 8 is typically arranged on the outer portion 10b of the first polycrystalline semiconductor layer 10a, 10b. The passivation layer 8 may, for example, also be made of silicon oxide, silicon nitride or silicon oxynitride.

A vertical thickness of the first polycrystalline semiconductor layer 10a, 10b is typically smaller than about 800 nm, more typically smaller than about 600 nm, and even more typically below 400 nm to facilitate manufacturing the diode 300. The vertical thickness of the first polycrystalline semiconductor layer 10a, 10b may, for example, be only about 50 nm. A comparatively low vertical thickness of the first polycrystalline semiconductor layer 10a, 10b reduces processing variations of the field plates 10b. A vertical thickness of the second polycrystalline semiconductor layer 11 may be larger, for example larger than 1 μm or even 2 μm.

Figure 4:
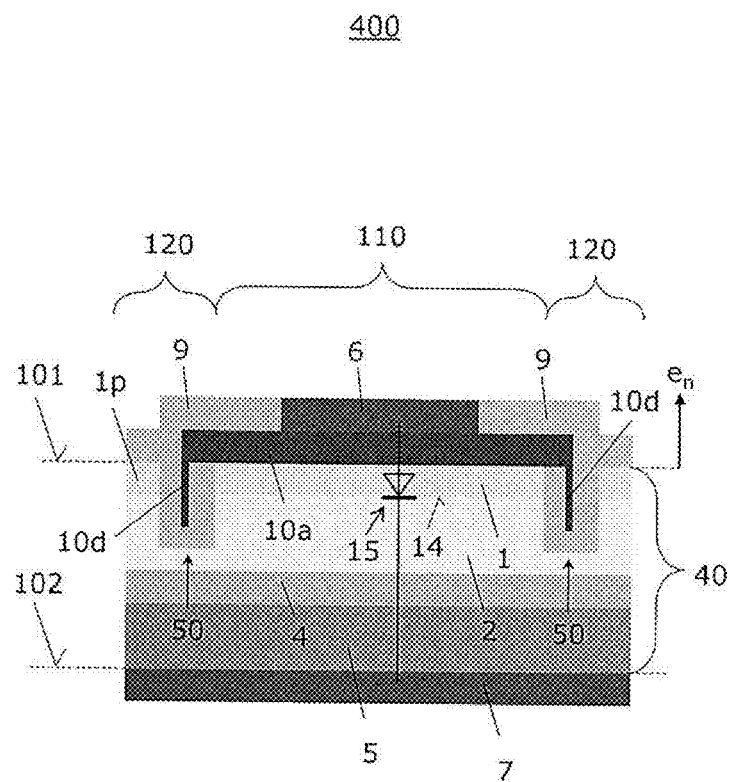
FIG. 4 illustrates a vertical cross-section through a semiconductor diode according to an embodiment.

FIG. 4 illustrates a vertical cross-section through a semiconductor diode 400. The semiconductor diode 400 shown in FIG. 4 is similar to the semiconductor diode 100 explained above with regard to FIG. 1. However, the semiconductor diode 400 shown in FIG. 4 is provided with a different edge-termination structure. For sake of clarity, an optional field-stop region is not shown in FIG. 4.

In the exemplary embodiment illustrated in FIG. 4, the edge-termination structure includes an insulated trench field plate 10d. The trench field plate 10d is arranged in the vertical trenches 50 and in contact with the polycrystalline semiconductor region 10a.

The features explained above with regard to FIGS. 1 to 4 may also be combined. For example, a bi-layered or even multi-layered structure of the polycrystalline silicon semiconductor region as explained with regard to FIG. 3 may also be provided for the diodes 100, 200 and 400 explained with regard to FIGS. 1, 2 and 4, respectively.

Alternatively or in addition, other edge-termination structures may be provided. For example, a VLD structure (variation of lateral doping) or a JTE structure (junction termination extension) may be formed in the peripheral area 120 to increase the break down voltage of the semiconductor diodes when the pn-junction 14 is reverse biased.

Furthermore, the edge-termination structures may be provided with covering structures like insulators or passivation layers in order to prevent creepage currents and flashover or to maintain the blocking capability even in humidity and long lasting blocking operation.

The anode structure formed by the first semiconductor region 1 and the polycrystalline silicon semiconductor region 10a, 11 adjoining the anode metallization 6 has a very low charge carrier life time in the polycrystalline silicon semiconductor region 10a, 11. Further, the first semiconductor region 1 has at least at and/or close to the pn-junction 14 formed with drift region 2 a low doping concentration. During operation, the first semiconductor region 1 may be partly or totally flooded with charge carriers in a forward current direction while the injection of charge carriers into the drift region 2 remains low. This allows for adjusting the charge carrier life time of the drift region 2 with a low concentration of impurities and/or lattice defects. The integral doping concentration Q1 of the first semiconductor region 1 integrated on a path along the normal direction $e_n$ of the first surface 101 is typically chosen such that the static electric field during reverse bias substantially drops to zero below the polycrystalline silicon semiconductor region 10a, 11. Accordingly, both reverse current and current generation in the drift zone 2 during reverse bias are low. Furthermore, the dynamic penetration of the electric field to the anode metallization 6 during fast commutation is prohibited by the highly doped portion of the polycrystalline silicon semiconductor region 10a, 11 adjoining the anode metallization 6 and having a very low charge carrier life time. Due to the very low charge carrier life time, minority charge carriers injected into the polycrystalline silicon semiconductor region 10a, 11 recombine quickly.

According to an embodiment, the first semiconductor region 1 of diodes 100 to 400 has a first maximum doping concentration, typically at the first surface 101, of less than about $5*10^{17}$ cm$^{-3}$ suitable for high-voltage applications.

According to an embodiment, the integral doping concentration Q1 of the first semiconductor region 1 is below $10^{13}$ doping atoms/cm$^2$ or even below $2*10^{12}$ doping atoms/cm$^2$ or even below $1.2*10^{12}$ doping atoms/cm$^2$.

In the following, embodiments pertaining to manufacturing methods for forming semiconductor diodes are explained.

FIGS. 5 to 9 illustrate a method for producing the semiconductor diode 100 shown in FIG. 1. These figures show vertical cross-sections through the semiconductor diode 100 during or after particular method steps. In a first process, a semiconductor body 40, for example a wafer or substrate 40, having a first surface 101 and a second surface 102 opposite the first surface 101 is provided. The normal direction $e_n$ of the first surface 101 is substantially parallel to the vertical direction.

The semiconductor body 40 can be a single bulk monocrystalline material. It is also possible that the semiconductor body 40 includes a bulk mono-crystalline material 20 and at least one epitaxial layer 30 formed thereon.

Figure 5:
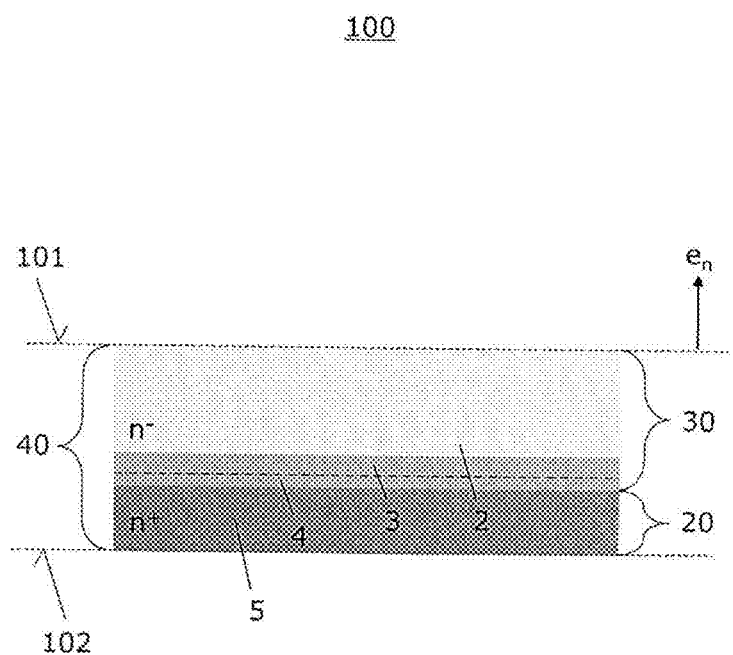
FIGS. 5 to 9 illustrate vertical cross-sections through a semiconductor device during method steps of a method according to embodiments.

In the exemplary embodiment illustrated in FIG. 5, the semiconductor body 40 includes an optional n$^+$-type semiconductor substrate 5 extending to the second surface 102, an n$^+$-type fourth semiconductor region 4 or cathode region 4 arranged on the semiconductor substrate 5, an optional n-type third semiconductor region 3 or field-stop region 3 arranged on the cathode region 4 and an n$^-$-type second semiconductor 2 or drift region 2 arranged on the field-stop region 3.

Figure 6:
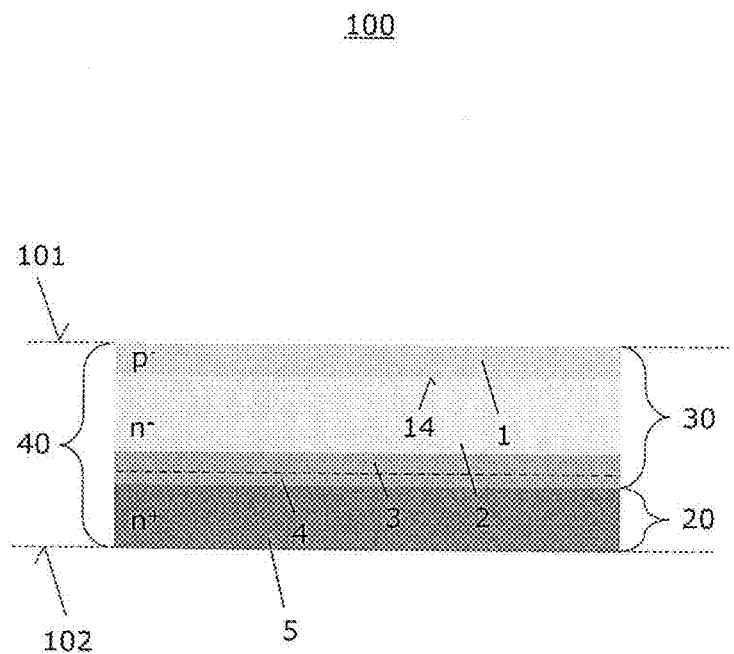

Referring to FIG. 6, a p$^-$-type first semiconductor region 1 having a first maximum doping concentration and extending to the first surface 101 is formed in the second semiconductor region 2. Accordingly, a substantially horizontal pn-junction 14 is formed in the semiconductor body 40.

In the semiconductor diode 100 to be produced the first semiconductor region 1 typically forms an anode region and a part of the anode emitter structure, respectively. Typically, forming the first semiconductor region 1 includes implanting dopants through the first surface 101 to precisely adjust the concentration of dopants, for example boron.

Figure 7:
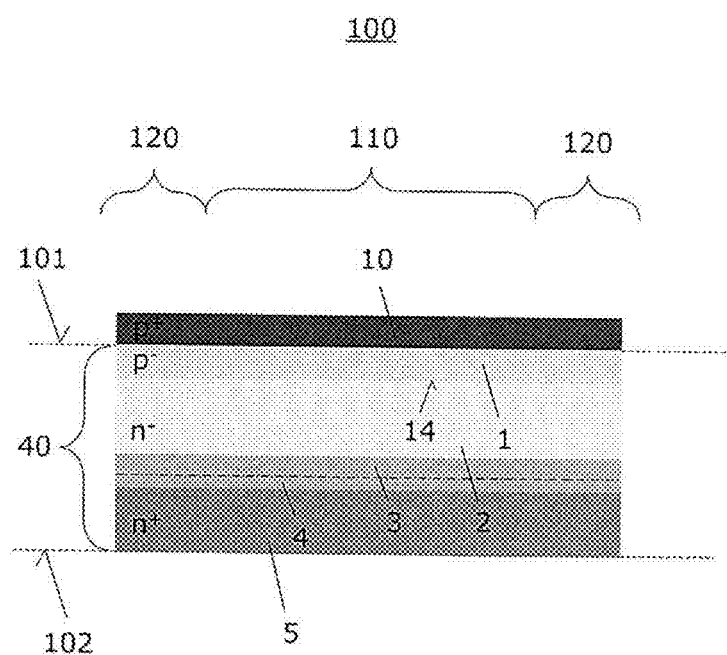

Referring to FIG. 7, a p$^+$-type polycrystalline silicon semiconductor region 10 having a second maximum doping concentration which is higher than the first maximum doping concentration is formed on and in contact with the first semiconductor region 1. Typically, the polycrystalline silicon semiconductor region 10 has the second maximum doping concentration at or at least close to the upper surface to provide a low resistive contact to an anode metallization to be formed on the polycrystalline silicon semiconductor region 10. Typically, the doping concentration of the polycrystalline silicon semiconductor region 10 decreases towards the first semiconductor region 1.

According to an embodiment, the polycrystalline silicon semiconductor region 10 is deposited as a boron-doped polycrystalline silicon layer. Typically, boron-doped polycrystalline silicon is mask-less deposited using a LPCVD-process in a temperature range from about 600° C. to about 800° C. For example, diboran-doped (B$_2$H$_6$-doped) polycrystalline silicon may be deposited at a temperature of about 680° C. Accordingly, the formed the silicon semiconductor region 10 has a low granularity and thus a low charge carrier life time.

The polycrystalline silicon semiconductor region 10 may also be formed by depositing substantially not-doped polycrystalline silicon using, for example, a LPCVD-process and subsequent implantation and drive-in processes. Furthermore, polycrystalline silicon semiconductor region 10 may be formed by several cycles of deposition and implantation followed by a common thermal drive-in process. Even further, implanted ions of the first semiconductor region 1 and the polycrystalline silicon semiconductor region 10 may be activated in the common thermal drive-in process.

The first semiconductor region 1 may alternatively be formed by out diffusion of dopants from the polycrystalline silicon semiconductor region 10 and thermal activation.

Thereafter, an active area 110 and a peripheral area 120 are typically defined.

Figure 8:
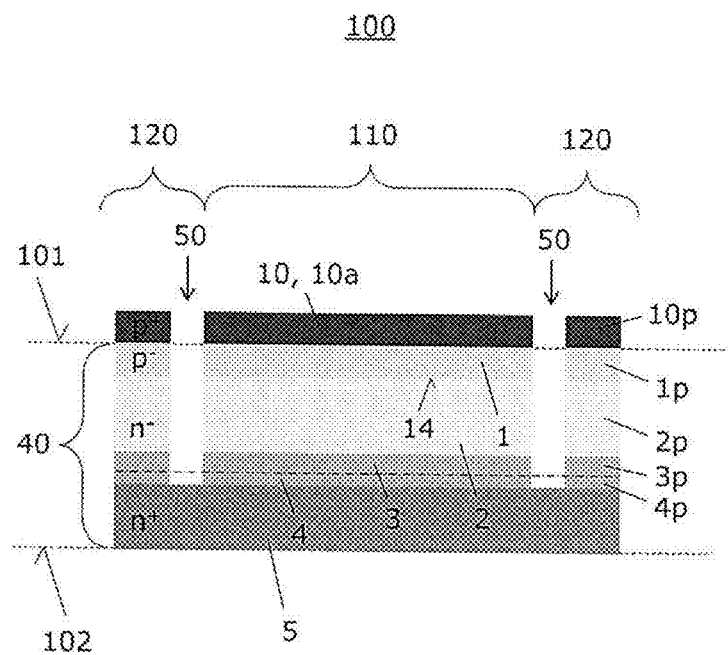

Referring to FIG. 8, a vertical trench 50 is etched in the peripheral area 120 next to the active area 110 from the first surface 101 into the semiconductor body 40. Accordingly, the polycrystalline silicon semiconductor region 10 is divided in two portions, a central portion 10a and one or more peripheral portions 10p. Likewise and depending on the penetration depth of the trench 50 into the semiconductor body 40, the first semiconductor region 1, the second semiconductor region 2, the third semiconductor region 3 and the fourth semiconductor region 4 may be divided into a central portion 1 to 4 and peripheral portions 1p to 4p, respectively.

Figure 9:
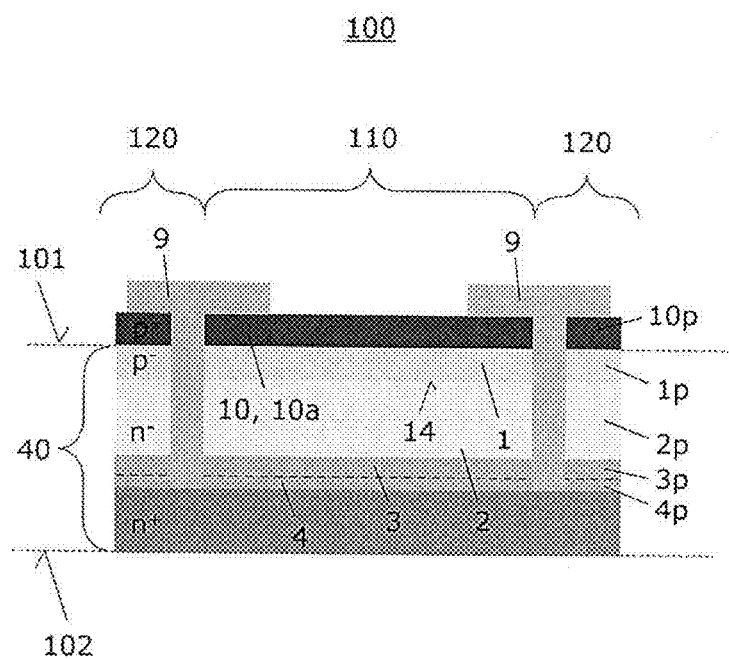

Referring to FIG. 9, an insulating region 9 is formed in the vertical trench 50 and partly on the polycrystalline silicon semiconductor region 10, 10a, 10p. In the illustrated vertical cross-section the insulating region 9 has two T-shaped portions which typically correspond to a substantially ring-shaped structure. Accordingly, an edge-termination structure 9 adjoining the polycrystalline silicon semiconductor region 10, 10a, 10p is formed. The insulating region 9 may be formed by thermal oxidation and/or by deposition of, for example, silicon oxide, silicon nitride and/or siliconoxynitride followed by masked back-etching.

Thereafter, a first metallization 6 is formed on and in electric contact with the polycrystalline semiconductor region 10a and a second metallization 7 is formed on and in electric contact with the semiconductor substrate 5. The resulting diode 100 is illustrated in FIG. 1.

Figure 10:
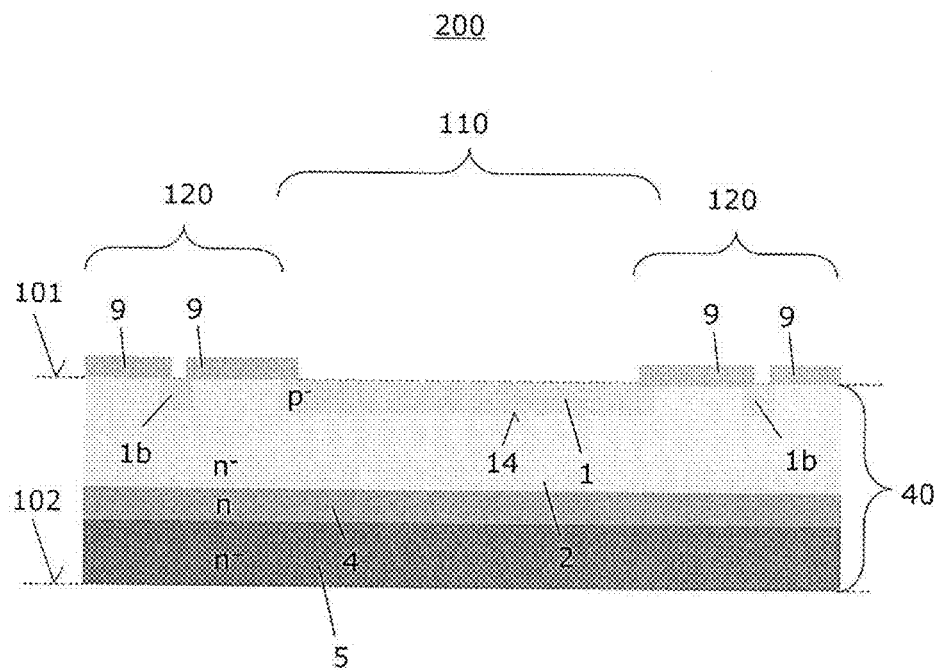
FIGS. 10 to 11 illustrate vertical cross-sections through a semiconductor device during method steps of a method according to embodiments.
Figure 11:
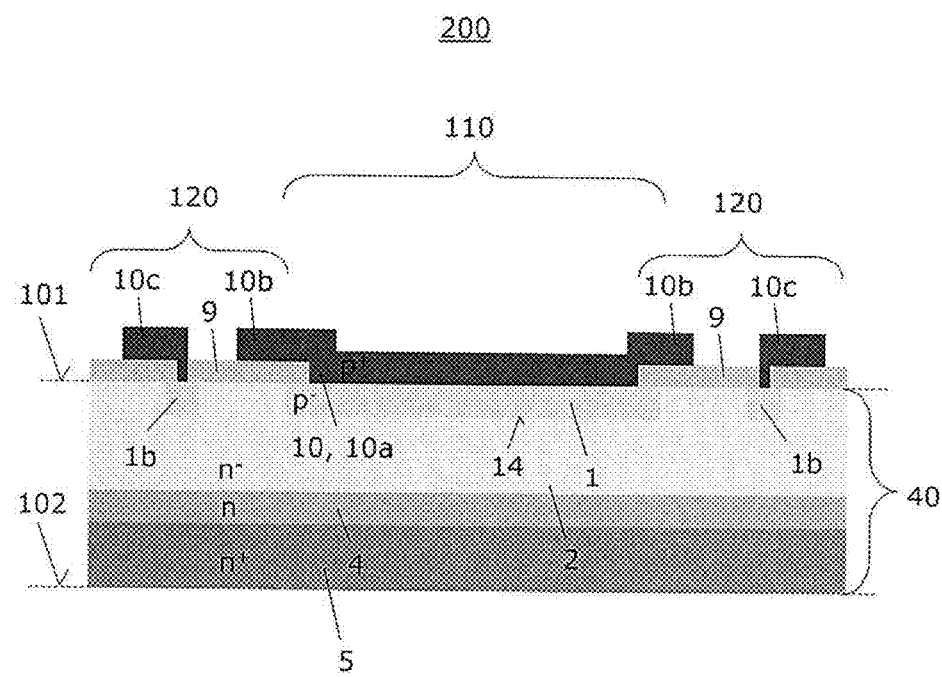

FIGS. 10 and 11 illustrate a method for producing the semiconductor diode 200 shown in FIG. 2. These figures show vertical cross-sections through the semiconductor diode 200 during or after particular method steps. Similar as explained above with regard to FIG. 5 a semiconductor body 40 with an optional $n^+$-type semiconductor substrate 5, an $n^+$-type cathode region 4, an optional n-type field-stop region 3 (not shown) and an $n^-$-type drift region 2 is provided.

Thereafter, insulating regions 9 are typically formed on the first surface 101, for example by thermal oxidation and/or deposition of, for example, silicon oxide, silicon nitride and/or siliconoxynitride, and by subsequent masked etching to expose portions of the semiconductor body 40 on the first surface 101. Thereafter, a $p^-$-type first semiconductor region 1 and one or more $p^-$-type semiconductor regions 1b may be formed, e.g. by ion implantation using the insulating regions 9 as a mask and a thermal anneal step. Accordingly, a pn-junction 14 is formed between the first semiconductor region 1 and the drift region 2. The first semiconductor region 1 of the semiconductor diode 200 is only formed in an active area 110. Furthermore, one or more $p^-$-type semiconductor regions 1b are formed in the peripheral area 120 in common processes with the first semiconductor region 1. The resulting semiconductor structure 200 is illustrated in FIG. 10.

Thereafter, a polycrystalline semiconductor layer 10 is deposited similar as explained above with regard to FIG. 7 and etched back using a mask. The resulting semiconductor structure 200 is illustrated in FIG. 11. Accordingly, a polycrystalline silicon semiconductor region 10a, adjoining polycrystalline silicon field plates 10b and polycrystalline silicon field plates 10c in contact with respective semiconductor regions 1b typically forming floating guard rings are formed in common processes. The illustrated pairwise structures 1b, 9, 10b, 10c may correspond to respective single and substantially ring-shaped structures 1b, 9, 10b, 10c.

Thereafter, a first metallization 6 is formed on and in electric contact with the polycrystalline semiconductor region 10a and a second metallization 7 is formed on and in electric contact with the semiconductor substrate 5. The resulting diode 200 is illustrated in FIG. 2.

Figure 12:
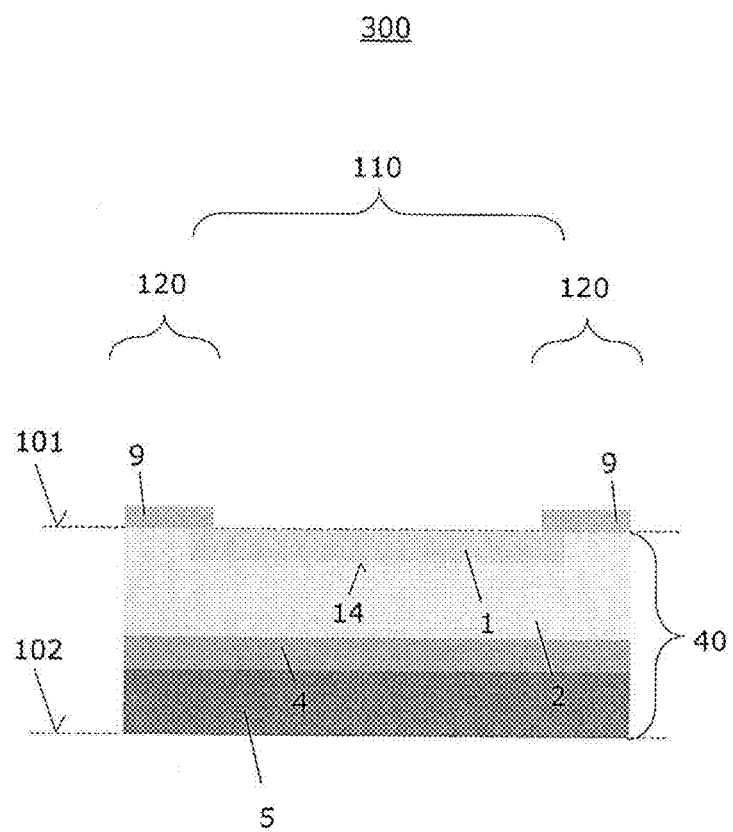
FIGS. 12 to 14 illustrate vertical cross-sections through a semiconductor device during method steps of a method according to embodiments.
Figure 13:
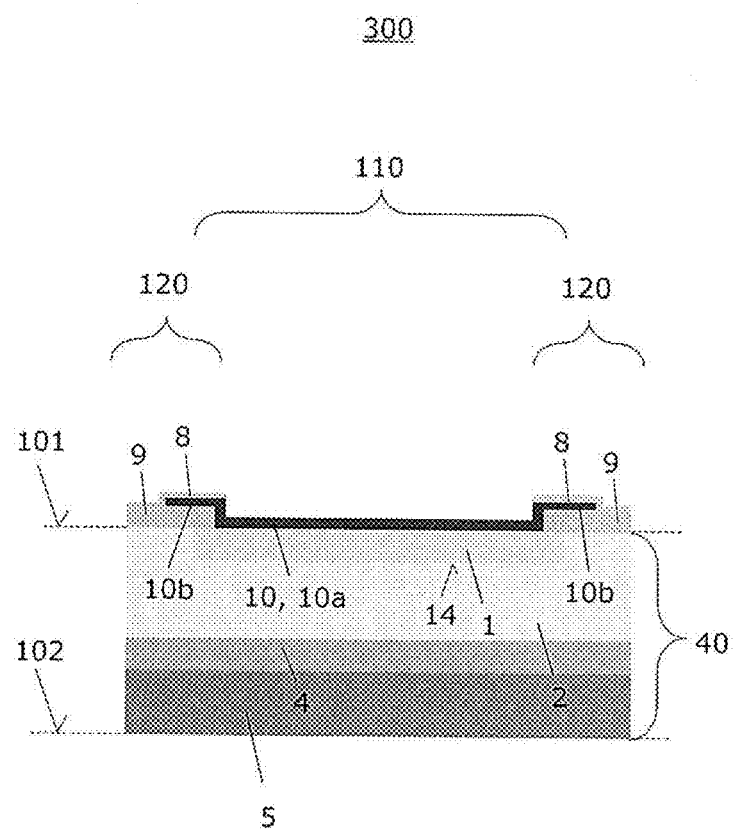
Figure 14:
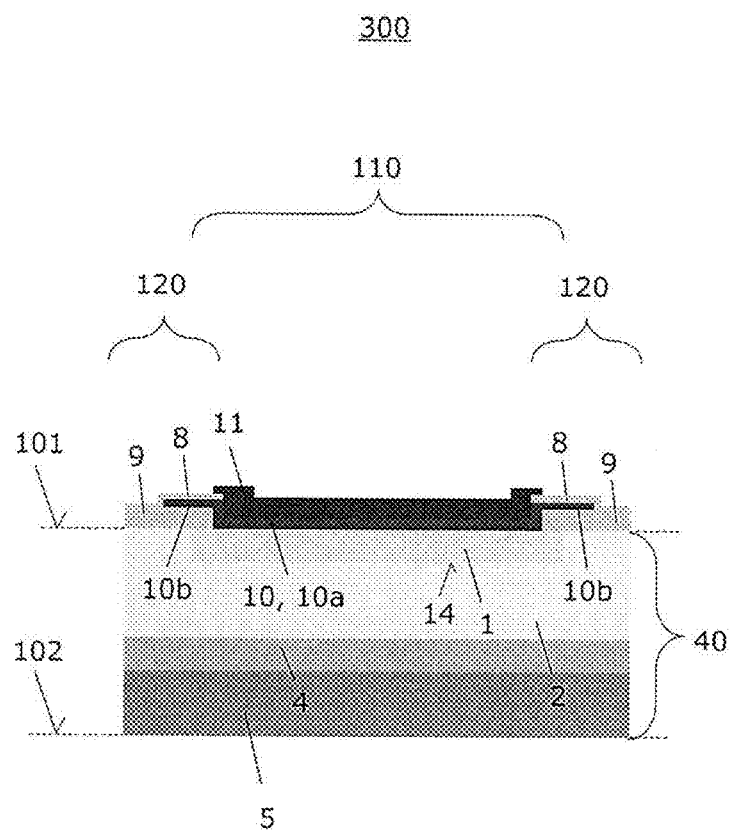

FIGS. 12 to 14 illustrate a method for producing the semiconductor diode 300 shown in FIG. 3. These figures show vertical cross-sections through the semiconductor diode 300 during or after particular method steps. Similar as explained above with regard to FIG. 5 a semiconductor body 40 with an optional $n^+$-type semiconductor substrate 5, an $n^+$-type cathode region 4, an optional n-type field-stop region 3 (not shown) and an $n^-$-type drift region 2 is provided.

Thereafter, insulating regions 9 are typically formed on the first surface 101, for example by thermal oxidation and/or deposition of, for example, silicon oxide, silicon nitride and/or siliconoxynitride, and by subsequent masked etching to expose a central portion of the semiconductor body 40 on the first surface 101. Thereafter, a $p^-$-type first semiconductor region 1 may be formed in the drift region 2, e. g. by ion implantation using the insulating regions 9 as a mask and a thermal anneal step. Accordingly, the first semiconductor region 1 is only formed in active area 110. The resulting semiconductor structure 300 is illustrated in FIG. 12.

Thereafter, a first polycrystalline silicon layer 10 is deposited, typically with a thickness of less than about 800 nm, more typically with a thickness of less than 600 nm, for example with a thickness of about 50 nm to about 400 nm.

According to an embodiment, the first polycrystalline silicon layer 10 is formed as a weakly or a substantially non-doped polycrystalline silicon layer, for example deposited using a LPCVD-process at a temperature below about 650° C., for example at about 620° C.

Thereafter, the first polycrystalline silicon layer 10 is partly etched in the peripheral area 120. Depositing a comparatively thin first polycrystalline silicon layer 10 facilitates structuring of the thin first polycrystalline silicon layer 10 in the peripheral area 120. Accordingly, the horizontal extension of a field plate 10b formed by a remaining portion of the first polycrystalline silicon layer 10 on the insulating region 9 may precisely be defined and/or processing variations reduced.

Thereafter, the field plate 10b is typical covered with a further insulating layer 8 of, for example, silicon oxide, silicon nitride or siliconoxynitride. This insulating layer 8 may be structured e.g. by etching through a mask. The resulting semiconductor structure 300 is illustrated in FIG. 13.

Thereafter, a second polycrystalline silicon layer 11 having a doping concentration which is higher than the doping concentration of the first polycrystalline silicon layer 10 is formed on the first polycrystalline silicon layer 10 as illustrated in FIG. 14. Forming the second polycrystalline silicon layer 11 typically includes depositing boron-doped polycrystalline silicon as explained above with regard to FIG. 7 and masked back-etching.

Thereafter, a first metallization 6 is formed on and in electric contact with the polycrystalline semiconductor region 10a and a second metallization 7 is formed on and in electric contact with the semiconductor substrate 5. Alternatively, for etching the first metallization 6 and the second polycrystalline silicon layer 11, the same mask and/or etching process using different etching steps may be used. The resulting diode 300 is illustrated in FIG. 3.

Figure 15:
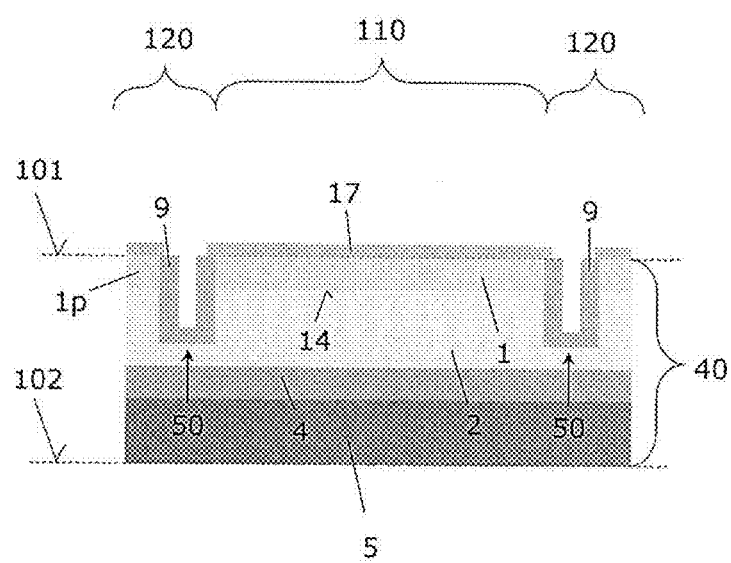
FIGS. 15 to 17 illustrate vertical cross-sections through a semiconductor device during method steps of a method according to further embodiments.
Figure 17:
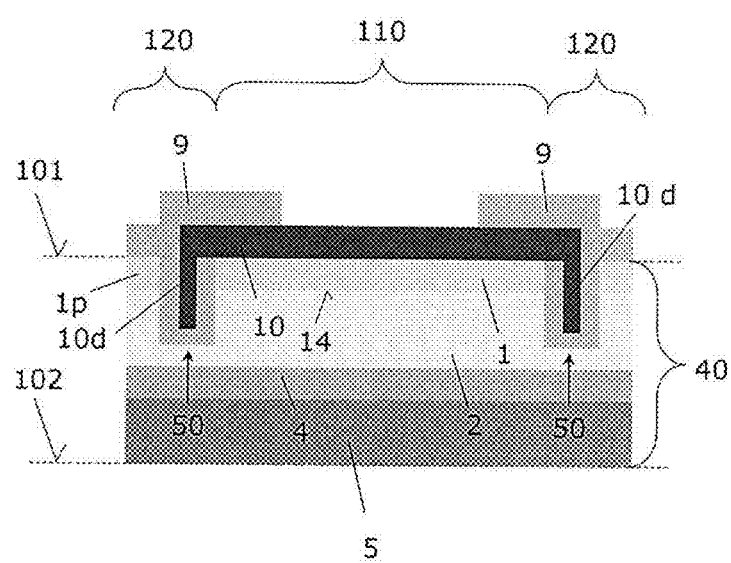

FIGS. 15 and 17 illustrate a method for producing the semiconductor diode 400 shown in FIG. 4. These figures show vertical cross-sections through the semiconductor diode 400 during or after particular method steps. Similar as explained above with regard to FIGS. 5 and 6, a semiconductor body 40 with an optional $n^+$-type semiconductor substrate 5, an $n^+$-type cathode region 4, an optional n-type field-stop region 3 (not shown) and an $n^-$-type drift region 2 is provided. Further, a first semiconductor region 1 is formed in the drift region 2, for example by implantation. Thereafter, a mask 17, for example a silicon nitride mask or a mask containing a stack of one or more layers of silicon nitride and silicon dioxide is formed on the first surface 101. The mask 17 defines an active 110 and a peripheral area 120. In the peripheral area 120 a vertical trench 50 is etched through the mask 17 from the first surface 101 into the semiconductor body 40. Thereafter, insulating regions 9 are formed on side-walls and bottom-walls of the vertical trench 50, for example by thermal oxidation. The resulting semiconductor structure 300 is illustrated in FIG. 15.

Figure 16:
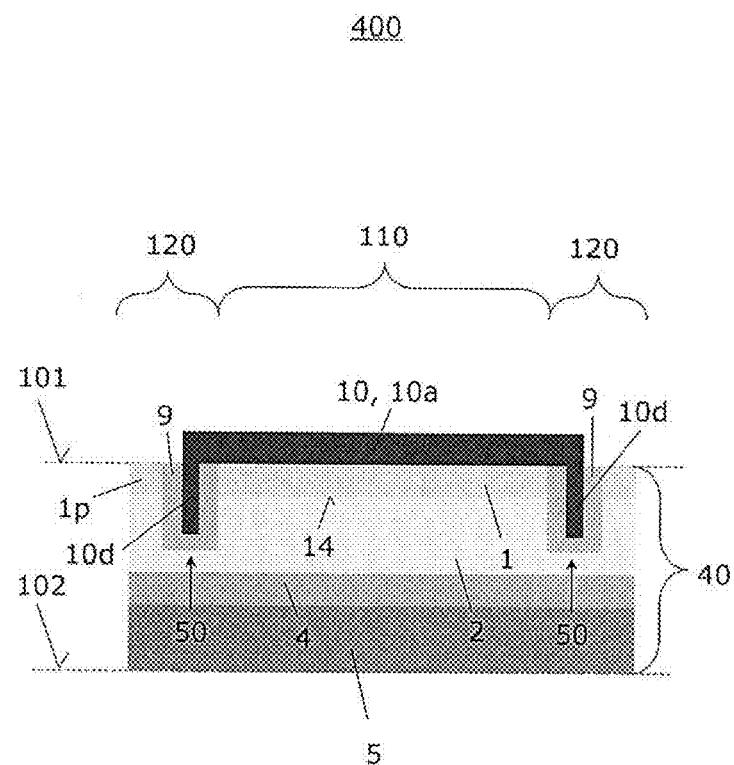

Thereafter, the mask 17 is removed or opened and a polycrystalline semiconductor layer 10 is, similar as explained above with regard to FIG. 7, deposited from the first surface 101 and etched back using a mask. The resulting semiconductor structure 400 is illustrated in FIG. 16. Accordingly, a polycrystalline silicon semiconductor region 10*a* in contact with the first semiconductor region 1 and adjoining polycrystalline silicon trench field plates 10*d* are formed in common processes. The illustrated pairwise structures 1*p*, 9, 10*d* may correspond to respective single and substantially ring-shaped structures 1*p*, 9, 10*d*.

Referring to FIG. 17, the insulating regions 9 are typically extended, for example by deposition and masked etching, so that the semiconductor body 40 is covered in the peripheral area 120.

Thereafter, a first metallization 6 is formed on and in electric contact with the polycrystalline semiconductor region 10*a* and a second metallization 7 is formed on and in electric contact with the semiconductor substrate 5. The resulting diode 400 is illustrated in FIG. 4.

The methods explained above with regard to FIGS. 5 to 17 may take advantage of the facts that the diffusion of dopants is significantly faster in polycrystalline silicon compared to monocrystalline silicon and that the polycrystalline semiconductor region 10*a*, 11 may be formed by several depositions with intermediate implantations. Accordingly, a vertical doping profile of the polycrystalline semiconductor region 10*a*, 11 may easily be optimized.

Typically, the vertical doping profile has a maximum value at or next to an interface between the polycrystalline semiconductor region 10*a*, 11 and the anode metallization 6 and a minimum value at or next to an interface between the polycrystalline semiconductor region 10*a*, 11 and the monocrystalline first semiconductor region 1. Accordingly, the formed anode emitter structure has a low emitter efficiency resulting in low switching losses and a high doping concentration in an upper portion resulting in both a good electric contact to the anode metallization 6 and in high robustness against break down during fast commutation and cosmic radiation, respectively.

Furthermore, the electric activation of implanted dopants of the monocrystalline first semiconductor region 1 and the polycrystalline semiconductor region 10*a*, 11 may be achieved in a common thermal process. Accordingly, the manufacturing may be more cost effective. For example, a rapid thermal process (RTP-anneal) of a few up to a few 10 seconds at a temperature of less than about 1000° C. or even less than about 800° C. may be used as common thermal process even for thicker polycrystalline semiconductor regions 10*a*, 11.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Such modifications to the inventive concept are intended to be covered by the appended claims.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor diode, comprising:
a monocrystalline silicon semiconductor body comprising a first surface, a second surface opposite the first surface, a first monocrystalline semiconductor region of a first conductivity type extending to the first surface and having a first maximum doping concentration, a second monocrystalline semiconductor region of a second conductivity type, the first semiconductor region forming a pn-junction with only the second semiconductor region, a fourth semiconductor region of the second conductivity type arranged between the second semiconductor region and the second surface and having a maximum doping concentration which is higher than a maximum doping concentration of the second semiconductor region, and a fifth semiconductor region of the second conductivity type arranged between the fourth semiconductor region and the second surface and having a maximum doping concentration which is higher than the maximum doping concentration of the fourth semiconductor region, wherein an integral doping concentration of the first semiconductor region is below $10^{13}$ doping atoms/cm$^2$, and wherein the integral doping concentration corresponds to an integral of a dopant concentration on a path which is perpendicular to the first surface and extends through the first semiconductor region;
a polycrystalline silicon semiconductor region of the first conductivity type having a second maximum doping concentration higher than the first maximum doping concentration and directly adjoining the first semiconductor region on the first surface, wherein the polycrystalline silicon semiconductor region has a substantially columnar grain structure throughout the polycrystalline silicon semiconductor region, wherein the second maximum doping concentration is larger than about $10^{19}$ doping atoms/cm$^3$, and wherein the polycrystalline silicon semiconductor region comprises silicon microcrystals sized less than about 300 nm throughout the polycrystalline silicon semiconductor region;
a first metallization arranged directly on and in electric contact with the polycrystalline semiconductor region; and an edge-termination structure next to the first semiconductor region,
wherein the first semiconductor region is partially enclosed by the second semiconductor region.

2. The semiconductor diode of claim 1, wherein the edge-termination structure comprises at least one of a field plate comprised of polycrystalline silicon and arranged on the first surface, a vertical trench arranged in the semiconductor body and comprising insulated walls, a trench field plate comprised of polycrystalline silicon and arranged in the semiconductor body, and a field plate comprised of polycrystalline silicon in direct contact with the semiconductor body.

3. The semiconductor diode of claim 2, wherein the polycrystalline silicon semiconductor region adjoins one of the field plate and the trench field plate.

4. The semiconductor diode of claim 1, wherein the polycrystalline silicon semiconductor region comprises a first portion and a second portion arranged between the first portion and the first metallization, the first portion adjoining the first semiconductor region and having a maximum doping concentration which is lower than the second maximum doping concentration.

5. The semiconductor diode of claim 1, wherein the polycrystalline silicon semiconductor region comprises boron as dopants.

6. The semiconductor diode of claim 1, wherein the polycrystalline silicon semiconductor region and the first semiconductor region form an anode emitter structure.

7. A semiconductor diode, comprising:
a monocrystalline semiconductor body comprising a first surface, a second surface disposed opposite the first surface, a pn-junction, a first monocrystalline semiconductor region of a first conductivity type having a first maximum doping concentration and extending from the pn-junction to the first surface, a second monocrystalline semiconductor region of a second conductivity type forming the pn-junction with the first semiconductor region, a fourth semiconductor region of the second conductivity type arranged between the second semiconductor region and the second surface and having a maximum doping concentration which is higher than a maximum doping concentration of the second semiconductor region, and a fifth semiconductor region of the second conductivity type arranged between the fourth semiconductor region and the second surface and having a maximum doping concentration which is higher than the maximum doping concentration of the fourth semiconductor region, wherein an integral doping concentration of the first semiconductor region is below $10^{13}$ doping atoms/cm$^2$, and wherein the integral doping concentration corresponds to an integral of a dopant concentration on a path which is perpendicular to the first surface and extends through the first semiconductor region;
a first polycrystalline semiconductor layer of the first conductivity type having a third maximum doping concentration and directly adjoining the first semiconductor region on the first surface, wherein the first polycrystalline semiconductor layer comprises silicon microcrystals sized in a range from about 50 nm to about 300 nm throughout the first polycrystalline silicon semiconductor layer, and wherein the first polycrystalline silicon semiconductor layer has a substantially columnar grain structure throughout the first polycrystalline silicon semiconductor layer;
a second polycrystalline semiconductor layer of the first conductivity type adjoining the first polycrystalline semiconductor layer, the second polycrystalline semiconductor layer having a substantially columnar grain structure throughout the second polycrystalline silicon semiconductor layer and having a second maximum doping concentration which is higher than the first maximum doping concentration and the third maximum doping concentration,
wherein the second maximum doping concentration is larger than about $10^{19}$ doping atoms/cm$^3$;
wherein the third maximum doping concentration is between about $10^{16}$ and $10^{18}$ doping atoms/cm$^3$;
a first metallization arranged directly on and electrically contacting the second polycrystalline semiconductor layer; and
a second metallization arranged on the second surface,
wherein the first semiconductor region forms the pn-junction only with the second semiconductor region,
wherein the first semiconductor region is partially enclosed by the second semiconductor region.

8. The semiconductor diode of claim 7, wherein the first polycrystalline semiconductor layer has a vertical thickness of less than about 800 nm.

9. The semiconductor diode of claim 7, wherein an outer portion of the first polycrystalline semiconductor layer forms a field plate.

10. A semiconductor diode, comprising:
a monocrystalline silicon semiconductor body comprising a first surface, a second surface disposed opposite the first surface, a pn-junction, a first monocrystalline semiconductor region of a first conductivity type having a first maximum doping concentration and extending from the pn-junction to the first surface, a second monocrystalline semiconductor region of a second conductivity type forming the pn-junction with the first semiconductor region, a fourth semiconductor region of the second conductivity type arranged between the second semiconductor region and the second surface and having a maximum doping concentration which is higher than a maximum doping concentration of the second semiconductor region, and a fifth semiconductor region of the second conductivity type arranged between the fourth semiconductor region and the second surface and having a maximum doping concentration which is higher than the maximum doping concentration of the fourth semiconductor region, wherein an integral doping concentration of the first semiconductor region is below $10^{13}$ doping atoms/cm$^2$, and wherein the integral doping concentration corresponds to an integral of a dopant concentration on a path which is perpendicular to the first surface and extends through the first semiconductor region;
a polycrystalline silicon semiconductor region of the first conductivity type directly adjoining the first semiconductor region on the first surface and having a second maximum doping concentration which is higher than the first maximum doping concentration and a granularity in a range from about 10 nm to about 1000 nm throughout the polycrystalline silicon semiconductor region, wherein the polycrystalline silicon semiconductor region has a substantially columnar grain structure throughout the polycrystalline silicon semiconductor region;
wherein the second maximum doping concentration is larger than about $10^{19}$ doping atoms/cm$^3$;

a first metallization arranged directly on the polycrystalline silicon semiconductor region and electrically contacting the first semiconductor region through the polycrystalline silicon semiconductor region; and
a second metallization arranged on the second surface,
wherein the first semiconductor region forms the pn-junction only with the second semiconductor region,
wherein the first semiconductor region is partially enclosed by the second semiconductor region.

11. The semiconductor diode of claim 10, wherein at least one of the first semiconductor region and the polycrystalline silicon semiconductor region comprises boron as dopants.

12. The semiconductor diode of claim 10, further comprising an edge-termination structure next to the pn-junction.

13. A semiconductor diode, comprising:
a monocrystalline silicon semiconductor body comprising a first surface, a second surface opposite the first surface, a first monocrystalline semiconductor region of a first conductivity type extending from a pn-junction to the first surface and having a first maximum doping concentration at the first surface of less than about $5*10^{17}$ cm$^{-3}$, a second monocrystalline semiconductor region of a second conductivity type forming the pn-junction with the first semiconductor region, a fourth semiconductor region of the second conductivity type arranged between the second semiconductor region and the second surface and having a maximum doping concentration which is higher than a maximum doping concentration of the second semiconductor region, and a fifth semiconductor region of the second conductivity type arranged between the fourth semiconductor region and the second surface and having a maximum doping concentration which is higher than the maximum doping concentration of the fourth semiconductor region, wherein an integral doping concentration of the first semiconductor region is below $10^{13}$ doping atoms/cm$^2$, and wherein the integral doping concentration corresponds to an integral of a dopant concentration on a path which is perpendicular to the first surface and extends through the first semiconductor region;
a polycrystalline silicon semiconductor region of the first conductivity type adjoining the first semiconductor region directly on the first surface and having a second maximum doping concentration which is higher than the first maximum doping concentration;
wherein the polycrystalline silicon semiconductor region comprises silicon microcrystals sized in a range from about 50 nm to about 300 nm throughout the polycrystalline silicon semiconductor region,
wherein the polycrystalline silicon semiconductor region has a substantially columnar grain structure throughout the polycrystalline silicon semiconductor layer; and
wherein the second maximum doping concentration is larger than about $10^{19}$ doping atoms/cm$^3$;
a first metallization arranged directly on the polycrystalline silicon semiconductor region and in electric contact with the polycrystalline semiconductor region,
wherein a doping profile in the polycrystalline silicon semiconductor region has a maximum value at or next to an interface between the polycrystalline silicon semiconductor region and the first metallization and a minimum value at or next to an interface between the polycrystalline semiconductor region and the first semiconductor region, wherein the minimum value is between about $10^{16}$ and $10^{18}$ doping atoms/cm$^3$,
wherein the first semiconductor region forms the pn-junction only with the second semiconductor region,
wherein the first semiconductor region is partially enclosed by the second semiconductor region.

14. The semiconductor diode of claim 13, further comprising an edge-termination structure next to the pn-junction.

15. The semiconductor diode of claim 1, wherein the first semiconductor region comprises boron as dopants.

16. The semiconductor diode of claim 10, wherein the polycrystalline silicon semiconductor region has in a normal direction a thickness of at least 1 µm.

17. The semiconductor diode of claim 1 further comprising a second metallization arranged on the second surface and in resistive contact with the second semiconductor region.

18. The semiconductor diode of claim 1, wherein the integral doping concentration of the first semiconductor region is below $2*10^{12}$ doping atoms/cm$^2$.

19. The semiconductor diode of claim 13, wherein the semiconductor device is a vertical bipolar diode comprising a second metallization arranged on the second surface.

* * * * *